United States Patent
Kwan

(10) Patent No.: US 8,222,929 B1
(45) Date of Patent: Jul. 17, 2012

(54) HIGH VOLTAGE SWITCH PRE-DRIVER CIRCUIT

(75) Inventor: King Kwan, Belleview, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 361 days.

(21) Appl. No.: 12/690,067

(22) Filed: Jan. 19, 2010

Related U.S. Application Data

(63) Continuation of application No. 11/588,543, filed on Oct. 27, 2006, now abandoned.

(60) Provisional application No. 60/731,102, filed on Oct. 28, 2005.

(51) Int. Cl.
*H03B 1/00* (2006.01)
(52) U.S. Cl. .......... 327/108; 327/170; 327/427; 326/82
(58) Field of Classification Search .......... 327/108–112, 327/170, 427; 326/82, 83
See application file for complete search history.

(56) References Cited

U.S. PATENT DOCUMENTS

| | | | |
|---|---|---|---|
| 5,576,635 A | 11/1996 | Partovi et al. | |
| 6,313,661 B1 * | 11/2001 | Hsu | 326/81 |
| 6,313,672 B1 * | 11/2001 | Ajit et al. | 327/112 |

OTHER PUBLICATIONS

USPTO Notice of Allowance for U.S. Appl. No. 11/588,543 dated Oct. 16, 2009; 6 pages.
USPTO Final Rejection for U.S. Appl. No. 11/588,543 dated Aug. 5, 2009; 9 pages.
USPTO Non-Final Rejection for U.S. Appl. No. 11/588,543 dated Oct. 29, 2008; 9 pages.
USPTO Requirement for Restriction/Election for U.S. Appl. No. 11/588,543 dated Jun. 27, 2008; 5 pages.

* cited by examiner

*Primary Examiner* — Long Nguyen

(57) ABSTRACT

Switch pre-driver systems and methods are described. The present switch pre-driver systems and methods facilitate switch driver breakdown protection, reduction of leakage current, and avoidance of false switching. In one embodiment, a switch system includes a switch driver, a switch pre-driver, and a mode detection circuit. The switch driver drives a voltage. The switch pre-driver controls the switch driver. The mode detection circuit notifies the switch pre-driver of a mode condition.

20 Claims, 6 Drawing Sheets

600

610

PROTECTING A SWITCH DRIVER FROM DEVICE BREAKDOWN WHEN A HIGH VOLTAGE IS APPLIED.

620

REDUCING FALSE SWITCHING IN THE SWITCH DRIVER.

630

MINIMIZING LEAKAGE CURRENT IN SAID SWITCH DRIVER DURING NORMAL MODE

640

ADJUSTING A BIAS VOLTAGE.

Fig 6

HIGH VOLTAGE SWITCH PRE-DRIVER CIRCUIT

RELATED APPLICATIONS

This application is a continuation of U.S. Non-Provisional patent application Ser. No. 11/588,543, filed Oct. 27, 2006, which claims the benefit and priority of a commonly owned U.S. Provisional Patent Application entitled "HIGH VOLTAGE SWITCH PRE-DRIVER CIRCUIT", Ser. No. 60/731, 102, filed on Oct. 28, 2005, the entire contents of each of which are incorporated herein by reference.

TECHNICAL FIELD

The present invention relates generally to electronic circuits, and in particular to switch circuits.

BACKGROUND

Electronic systems and circuits have made a significant contribution towards the advancement of modern society and are utilized in a number of applications to achieve advantageous results. Numerous electronic technologies such as digital computers, calculators, audio devices, video equipment, and telephone systems facilitate increased productivity and cost reduction in analyzing and communicating data, ideas and trends in most areas of business, science, education and entertainment. Many of the electronic systems that provide these advantageous results often utilize switch circuits to connect to a voltage source. However, traditional attempts at connecting to multiple voltage levels often involve a variety of issues.

FIG. 1 shows a block diagram of a conventional super-high-voltage (SHV) switch circuit. In the conventional switch circuit, signal Vpp_in is the input with the voltage ranging from OV to the value of the super-high-voltage (SHV). The switch driver has two PMOS devices. Device M1 is the driver that drives Vpp_out to Vpp_in and device M2 serves as a keeper. When Vpp_in is at or below vpwr (stage 1), vdrive is pulled low turning on keeper transistor M2. When Vpp out is at vpwr the conventional circuit operates in normal mode. When Vpp_in is raised to a threshold (Vtp) above vpwr (stage 2), the switch is still in normal mode. Transistor MO turns on causing vdrive to start rising. At the same time, transistor M1 turns on because the Vgs of transistor M1 has reached a threshold. The current can start leaking through transistor M1 and transistor M2. When Vpp_in reaches above Vtrip (stage 3), Vpp_out is switched over to Vpp_in and the circuit is now in SHV mode.

Conventional circuit architectures can encounter difficulties at lower voltage processes. The gate-source voltage (Vgs) of M1 is the difference between Vpp_in and vpwr and there is a potential concern of device breakdown on the driver MI. In one exemplary process that implements the conventional design, the maximum SHV is 8.75V and the minimum vpwr is 1.6V. The Vgs of M1 can be as much as 7.15V while the junction breakdown voltage is only 5.5V. Another difficulty encountered in conventional approaches includes leakage current issues. When Vpp_in reaches a P-type threshold voltage (Vtp) above vpwr, driver M1 in FIG. 1 begins to turn on. The conventional design relies on the keeper M2 to sink enough current to prevent the circuit from switching over to SHV mode.

Conventional approaches also can encounter difficulties in effectively preventing false switching. It can be very difficult for the conventional design to set the Vtrip to be a few P-type threshold voltages (Vtp's) above the vpwr. Furthermore, it is often problematic for keeper M2 to sink sufficient current to keep the output at vpwr when relatively large current is driven through the switch driver to the output. It is also often difficult for the output Vpp_out to be pulled low in normal mode because of the keeper M2.

SUMMARY

Switch pre-driver systems and methods are described. The present switch pre-driver systems and methods facilitate switch driver breakdown protection, reduction of leakage current, and avoidance of false switching. In one embodiment, a switch system includes a switch driver, a switch pre-driver, and a mode detection circuit. The switch driver drives a voltage. The switch pre-driver controls the switch driver. The mode detection circuit notifies the switch pre-driver of a mode condition.

BRIEF DESCRIPTION OF THE DRAWINGS

FIG. 6 is a flow chart of an exemplary switching method in accordance with one embodiment of the present invention.

DETAILED DESCRIPTION

Reference will now be made to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Embodiments of the present invention are well suited to performing various other steps or variations of the steps recited herein, and in a sequence other than that depicted and/or described herein. It is appreciated that embodiments of the present invention can include hardware, firmware, and/or software. In one embodiment, processors and other electrical and electronic components perform processing associated with the present invention (e.g., executing computer readable and computer executable instructions comprising code included in a computer usable medium).

In one embodiment, a pre-driver architecture facilitates protection of a switch driver from break down conditions. The pre-driver architecture also controls disablement of a switch driver in normal mode minimizing leakage current and false switching. The pre-driver architecture prevents the switch driver from entering a voltage mode higher than voltages associated with a normal mode until the desired trip voltage is sensed.

Figure 1:
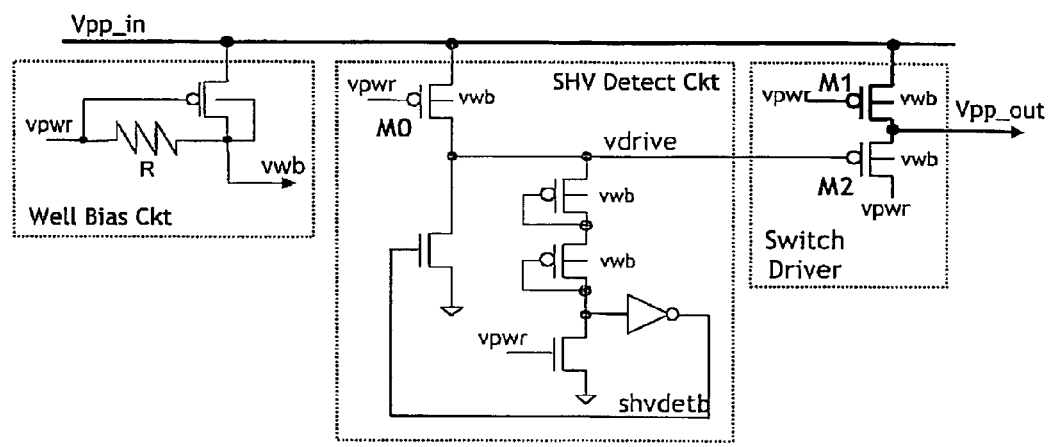
FIG. 1 is a block diagram of a exemplary conventional super-high-voltage (SHV) switch circuit.
Figure 2:
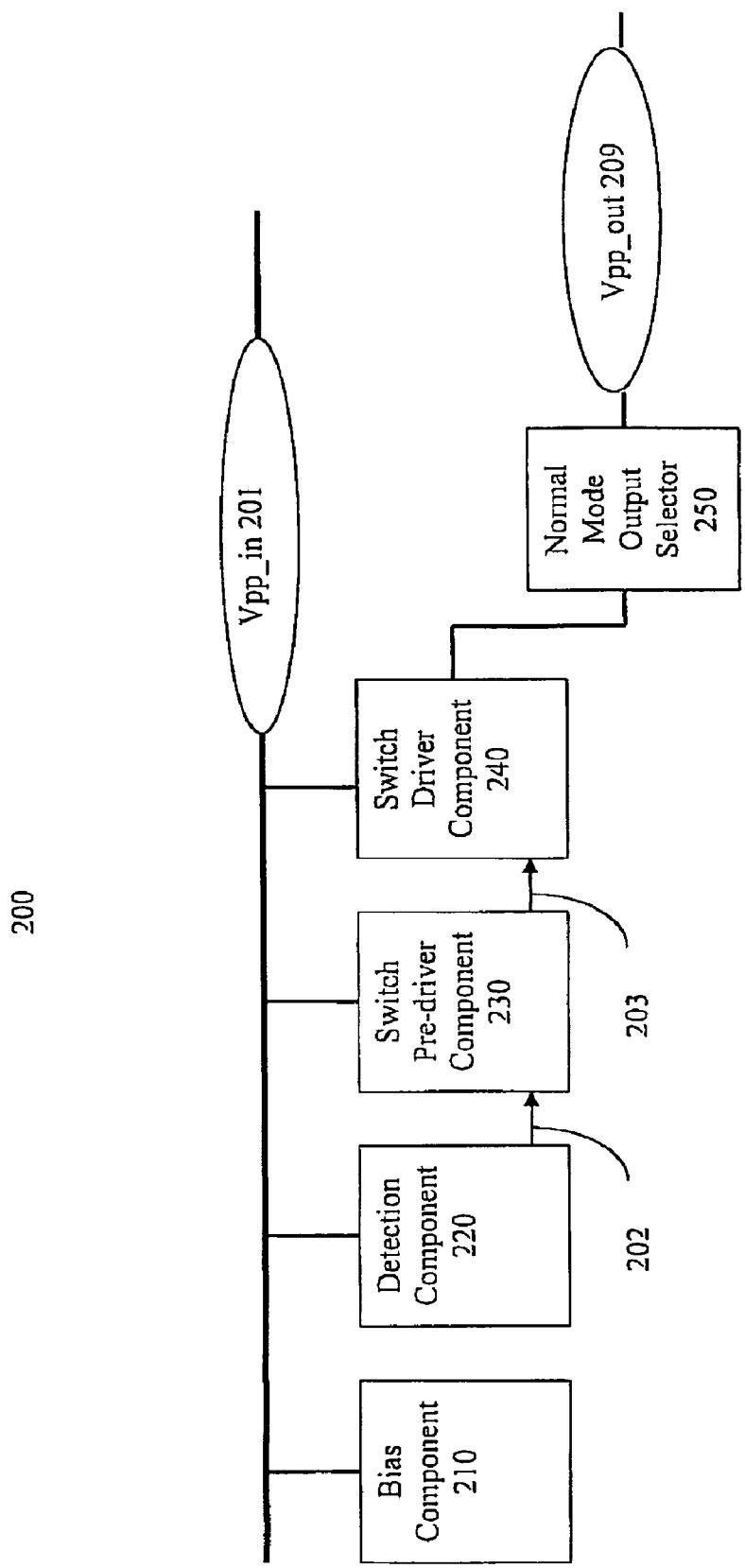
FIG. 2 is a block diagram of an exemplary switch system in accordance with one embodiment of the present invention.

FIG. 2 is a block diagram of exemplary switch system 200 in accordance with one embodiment of the present invention. Switch system 200 includes bias component 210, detection component 220, switch pre-driver component 230, switch driver component 240 and normal mode output selector 250. Bias component 210 is coupled to detection component 220, switch pre-driver component 230, and switch driver component 240. Detection component 220 is also coupled to switch pre-driver component 230 which is coupled to switch driver component 240. Switch driver component 240 output is coupled to normal mode output selector 250.

The components of switch system 200 cooperatively operate to provide efficient and reliable switching. Bias component 210 forwards bias voltages. In one embodiment, bias component 210 forwards a well bias voltage. Detection circuit 220 detects a mode condition trigger and forwards a signal 202 that notifies switch pre-drive component 230. In one embodiment, a mode condition trigger is associated with a relatively high voltage. It is appreciated that the node condition trigger or notification level can be adjusted. Switch pre-driver component 230 controls switch driver component 240. Switch driver component 240 drives a voltage.

In one embodiment, switch pre-driver 230 sets driver control signal 203 equal to a base power voltage level 201 (vpwr) disabling switch driver 240 when a point to point voltage level input (Vpp_in) is at or below the base power voltage level 201. Switch pre-driver 230 sets driver control signal 203 to follow point to point voltage input 201 (Vpp_in) keeping switch driver 240 turned off when point to point voltage input 201 (Vpp_in) is in between base power voltage level (vpwr) and a trip voltage (Vtrip). Switch pre-driver 230 sets driver control signal 203 to turn on switch driver 240 when point a point to point voltage input (Vpp_in) level is above a trip voltage (Vtrip). Output 203 switch pre-driver 230 is maintained at a level such that the difference between point to point voltage level 201 (Vpp_in) and driver control signal 203 (vppgate) is less than a breakdown limit of components of the switch driver component 240.

Figure 3:
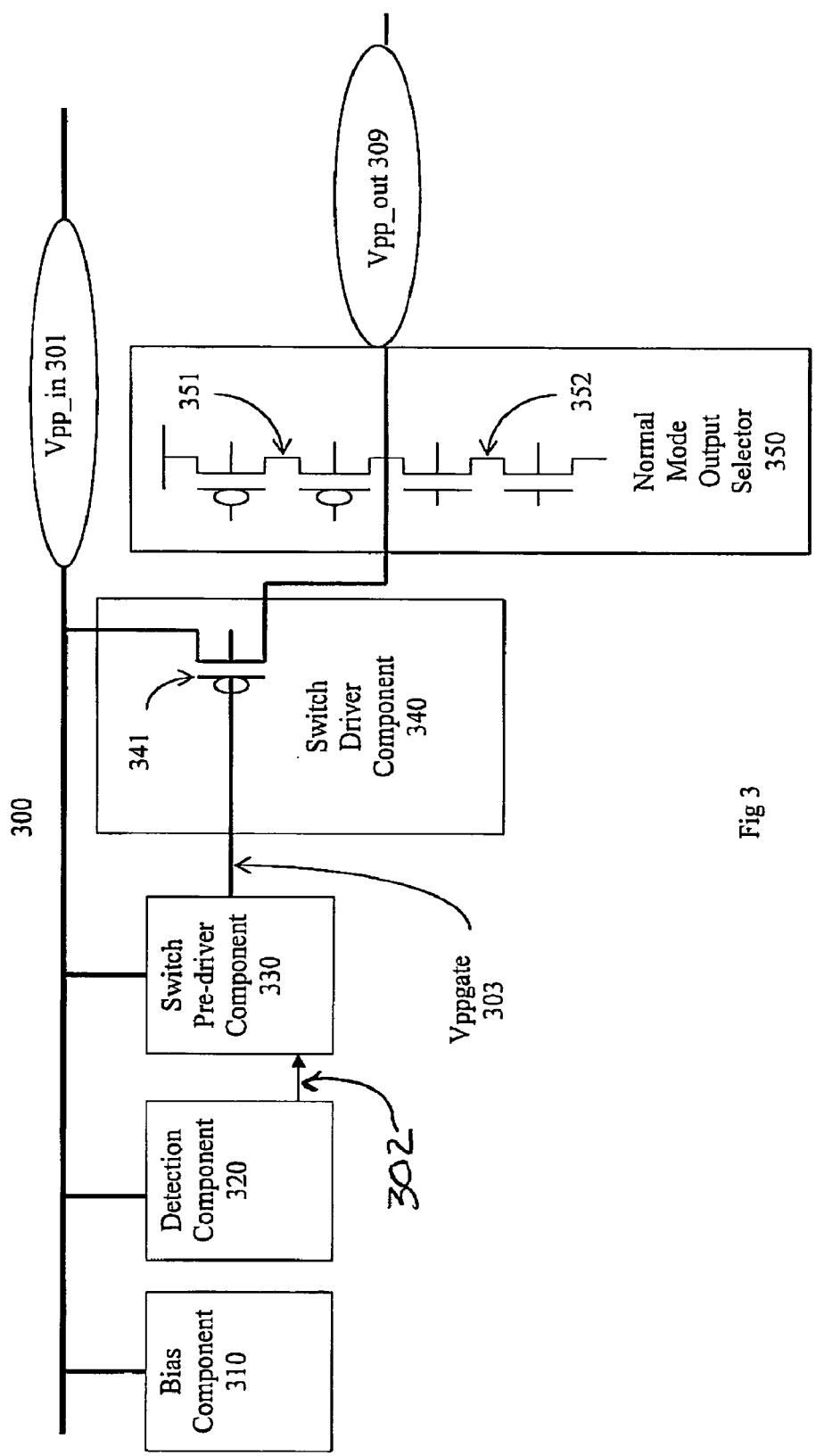
FIG. 3 is a block diagram illustrating an exemplary switch system in accordance with one embodiment of the present invention.

FIG. 3 is a block diagram illustrating exemplary switch system 300 in accordance with one embodiment of the present invention. Switch system 300 is similar to switch system 200 and includes bias component 310, detection component 320, switch pre-driver component 330, switch driver component 340 and normal mode output selector 350. Switch driver 340 includes a single PMOS device 341. Normal mode output selection component 350 includes a pull up component 351 and a pull down component 352. In one exemplary implementation, pull up component 351 includes plurality of PMOS transistor components and pull down component 352 includes multiple NMOS transistors.

Similar to switch system 200, the components of switch system 300 cooperatively operate to provide efficient and reliable switching. Detection component 320 senses voltage levels of input 301 Vpp_in. In a first stage, when the input Vpp_in is at or below vpwr (stage 1), the output 303 vppgate of switch pre-driver component 330 equals a base power vpwr disabling the switch driver component 340 keeping switch system 200 in a normal mode. In a second stage, when Vpp_in is between vpwr and Vtrip (stage 2), the output 303 vppgate of switch pre-driver component 330 follows the input 301 Vpp_in keeping the switch driver component 340 disabled, again keeping switch system 200 in a normal mode. In a third stage, when input Vpp-in is above Vtrip (stage 3), the switch driver component is turned on entering the high voltage (e.g., a SHV) mode. The switch pre-driver component output 303 vppgate is maintained at a level such that the difference between Vpp_in and vppgate is less than the breakdown limit of a transistor in switch driver component 340 (e.g., PMOS 341).

Figure 4:
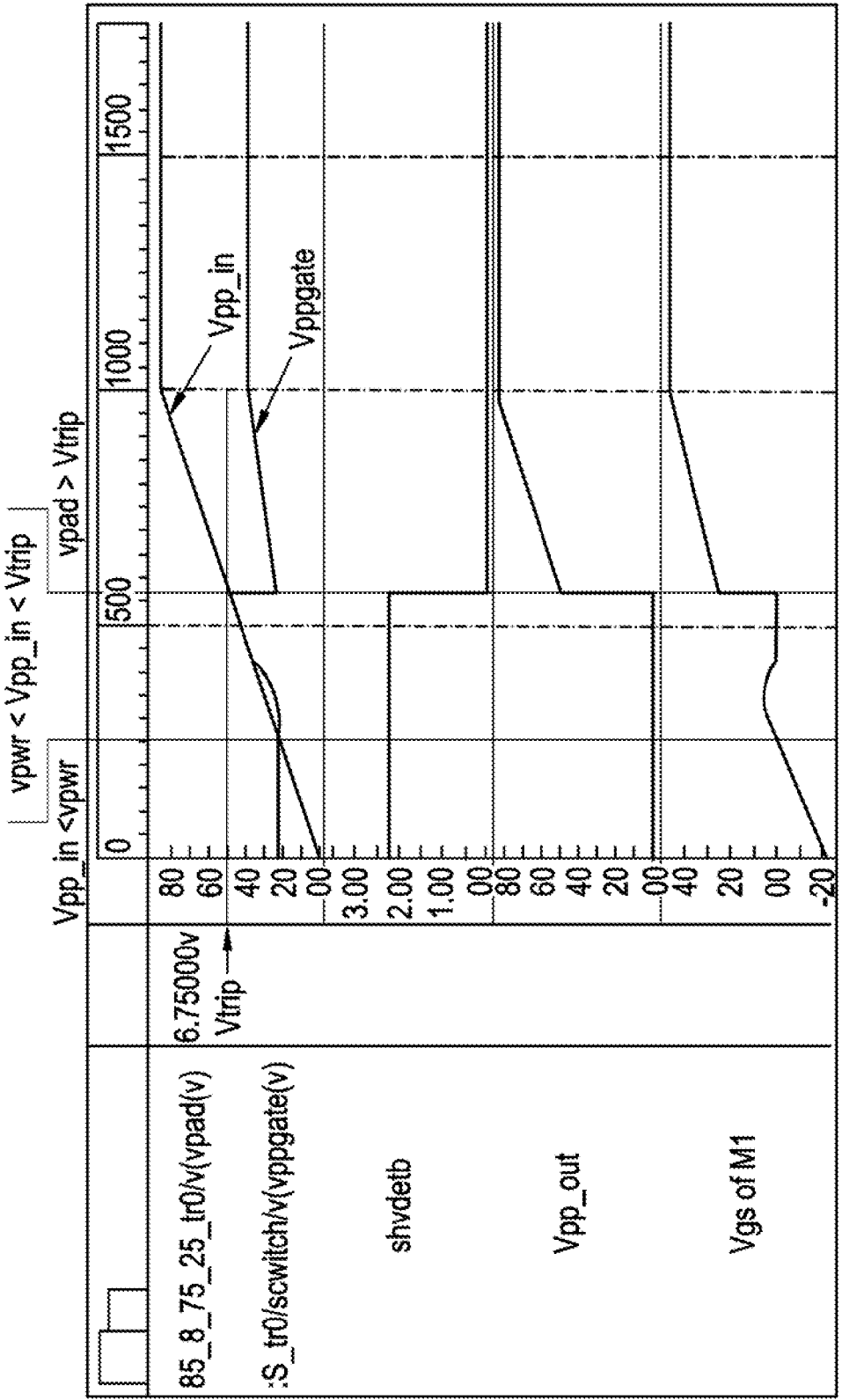
FIG. 4 shows exemplary graphical circuit simulation results of one implementation of a switch system in accordance with one embodiment of the present invention.

FIG. 4 shows exemplary graphical circuit simulation results of one implementation of switch system 300. The top panel shows the input Vpp_in and the pre-driver output vppgate. The second panel shows the detect circuit output shvdetb. The third panel shows the switch driver output Vpp_out. The 4th (bottom) panel shows the Vgs across the switch driver transistor 341. This Vgs is equal to the difference between Vpp_in and vppgate. In one exemplary simulation, the output Vpp_out is set to be pulled low in the normal mode. Before Vpp_in reaches Vtrip (e.g. about 5V in one embodiment design process and corner), the Vgs of transistor 341 is kept below a Vtp disabling transistor 341 and the output Vpp_out stays at ground. Once a mode trigger indication (e.g., a high voltage condition) is detected by the detect circuit, transistor 341 is turned on entering the high voltage mode. Note that the voltage on vppgate changes proportionally with Vpp_in. It is designed to ensure that the Vgs of transistor 341 stays out of the device breakdown limit.

It is appreciated that the present invention is readily implemented with the Vpp_out set to be pulled up in the normal mode. In one exemplary implementation there are a first high level (e.g., 5 volts) associated with normal mode and a second higher level (e.g., 8.75 volts) associated with high voltage or super high voltage mode. In one exemplary implementation, before Vpp_in reaches Vtrip the output Vpp_out is held high associated with normal mode but at a level lower than the high or super high voltage level. After Vpp_in reaches Vtrip the output Vpp_out is held at a high or super high voltage level that is higher than the high of a normal mode.

Figure 5:
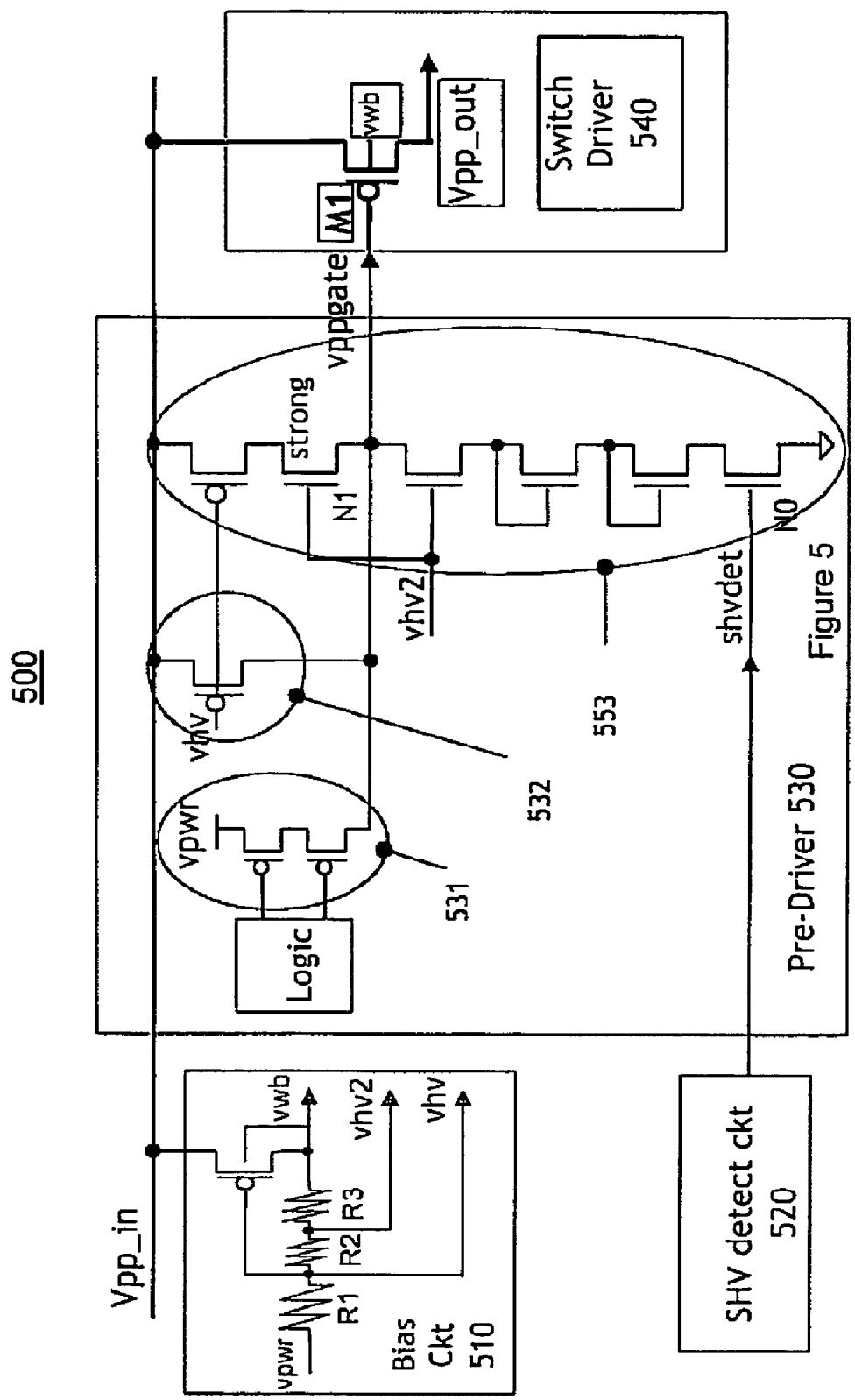
FIG. 5 shows a schematic of an exemplary improved pre-driver circuit in accordance with one embodiment of the present invention.

FIG. 5 is a block diagram illustrating exemplary switch system 500 including an exemplary improved pre-driver circuit in accordance with one embodiment of the present invention. Switch system 500 is similar to switch system 300 and includes bias component 510, detection component 520, switch pre-driver component 530, and switch driver component 540.

During a first stage, the first component or branch keeps vppgate at vpwr turning off the switch driver PMOS. The state of Vpp_out is determined by the pull-up and the pull-down circuit (e.g., similar to 351 and 352) not shown in FIG. 5. In one exemplary implementation, Vpp_out stays at ground when the pull down is enabled. The first component is disabled when Vpp_in is greater than vpwr plus Vtp.

In a second stage, Vpp_in is raised above vpwr. It turns off the first branch and the weak PMOS of the second component or branch turns on making vppgate follow Vpp_in. It keeps the switch driver in an off state (e.g., Vpp_out stays at 0V) and the switch stays in normal mode. The voltage vhv is generated from the bias generator resistor ladder shown on the left of FIG. 5. It is a high impedance signal. This vhv signal has the characteristics that when Vpp_in is less than vpwr, vhv equals to vpwr, and when Vpp_in goes above vpwr, vhv is sifting at about half of (Vpp_in−vpwr)/2. It provides a good mid-level voltage to bias and to protect devices from breakdown.

At a third stage, a high voltage mode condition is detected and signal shvdet goes high activating the third component or branch. The switch driver is turned on and the circuit enters SHV mode. The stack of NMOS draws a small keep-alive current. The signal vppgate is driven to be at (vhv2 Vtn) where Vtn is the threshold voltage of the strong NMOS N1. The Vgs of the switch driver M1 can be expressed as follows:

$$Vgs=(Vpp\ in-vppgate)=(Vpp\_in-vhv2+Vtn).$$

In one embodiment, bias component 510 forwards multiple bias voltages. In one exemplary implementation, bias component 510 forwards a first bias voltage for use as a well bias voltage. Bias component 510 can also forward a second and third bias voltage for use in avoiding switch driver breakdown when driving a relatively high voltage level. For example, bias component 510 can forward a second bias voltage (vhv) for use during a transition stage or a third bias voltage for use in a relatively high voltage stage. In one embodiment, vhv2 is set to be about a Vtn above the voltage vhv ensuring that the Vgs of transistor 341 does not exceed 5.5V across corners. The vhv2 level can be easily adjusted by connecting it to different level of the resistor ladder.

While the bias voltages are shown coming form a single bias component it is appreciated that the bias voltages can come from different components. In one exemplary implementation, bias component 510 is a well bias component. In another exemplary implementation, the well bias voltage can come from a well bias component and the first bias vhv and second bias vhv2 can come from a different bias component. It is also appreciated that the vhv2 can be adjusted by coupling to a different level of resistor in the bias resistor ladder shown in bias component 510.

It is appreciated that the present invention is readily implemented in a variety of embodiments. In one embodiment, a controlling device of a switch pre-driver component is a NMOS device instead of a PMOS device (e.g., device N0 shown in FIG. 5). In one exemplary implementation, an NMOS device is used if the Vtp variation across corners is better than Vtn. In addition the stack of NMOS pull-downs can also be implemented differently. In one embodiment, the stack is implemented to draw the keep-alive current to the third stage components or branch enabled.

Advantages of the improved solution include that the pre-driver architecture protects the switch driver from device breakdown. The improved solution is suitable for low-voltage processes. In addition the switch driver is disabled in normal mode, and minimizes leakage current and prevents false switching. As a result, the improved pre-driver circuit effectively prevents the SHV switch circuit from entering the SHV mode until reaching the desired trip voltage determined by the SHV detect circuit, which is useful for multiple-level multiple-supply designs. Another advantage is that when the circuit enters SHV mode, the Vgs of the switch driver PMOS is a function of the voltage vhv2. Voltage Vhv2 is generated from the well bias resistor ladder and can be easily adjusted by connecting to a different level of the resistor. The third advantage of the improved solution implementation is that it can make vppgate a function of one Vtn. Other implementations may make vppgate a function of multiple Vtn's or Vtp's. Also, Vtn varies less than the Vtp across corners in the common Nwell process. An analog simulation result of one exemplary Vppgate is shown in the following table:

|  | Min | Typical | Max | Unit |
| --- | --- | --- | --- | --- |
| Vppgate | 3.70 | 3.83 | 4.08 | V |

The voltage on vppgate varies about ±200 mV across process, voltage and temperature (PVT) corners.

FIG. 6 is a flow chart of switching method 600 in accordance with one embodiment of the present invention.

In block 610 a switch driver is protected from device breakdown when a high voltage is applied. In one embodiment, protecting the switch driver from device breakdown includes forcing a vppgate voltage to follow in the bias voltage vhv2 after a Vtrip voltage is detected.

In block 620 false switching in the switch driver is reduced. In one embodiment, the reducing false switching includes detecting a desired trip voltage and preventing the switch driver from entering an increased voltage level mode until the desired trip voltage is detected.

In block 630 leakage current is minimized in the switch driver during normal mode. In one embodiment, minimizing leakage current includes disabling or turning off the switch driver in normal mode.

In one embodiment, a bias voltage is adjusted at block 640. In one exemplary implementation, a bias voltage is coupled to a different level of a resistor ladder in a bias component.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The invention claimed is:

1. A switch system comprising:
   a switch driver to drive a voltage;
   a switch pre-driver to control the switch driver, wherein the pre-driver sets a driver control signal based upon a voltage input; and a detection circuit to activate the switch pre-driver in response to a high voltage mode signal, to maintain a level of the driver control signal output by the switch pre-driver such that a difference between the voltage input and the driver control signal is less than a breakdown limit of components of the switch driver.

2. A switch system of claim 1 wherein the switch driver is a single MOS transistor.

3. A switch system of claim 1 wherein the switch pre-driver sets the driver control signal equal to a base power voltage level disabling the switch driver when the voltage input is at or below the base power voltage level.

4. A switch system of claim 1 wherein the switch pre-driver outputs the driver control signal to follow the voltage input keeping the switch driver turned off when the voltage input is between a base power voltage level and a trip voltage.

5. A switch system of claim 1 wherein the switch pre-driver outputs the driver control signal to turn on the switch driver when the voltage input is above a trip voltage.

6. A switch system of claim 1 wherein the voltage input includes a point to point voltage input.

7. A switch system of claim 2 further comprising a well bias device to apply at least one bias voltage to the switch pre-driver.

8. A switch system of claim 7 wherein the bias level is adjustable.

9. A switch system of claim 7 wherein an output of the switch pre-driver is a function of one gate threshold voltage.

10. A switch system comprising:
a switch driver to drive a voltage;
a switch pre-driver to control the switch driver based upon a voltage input (Vpp_in); wherein the switch pre-driver includes:
a first component for setting to set an output of the switch pre-driver equal to a base power voltage level (vpwr);
a second component to set the output of the switch pre-driver equal to a transition voltage level;
a third component to set the output of the switch pre-driver equal to a pre-determined voltage level (vppgate) during a high voltage mode, a difference between Vpp_in and vppgate is less than a breakdown limit of components of the switch driver; and
a detection circuit to activate the switch pre-driver in response to a high voltage mode input signal, to couple vppgate to turn on the switch driver.

11. A switch system of claim 10 wherein the second component includes a PMOS transistor, and the first component is disabled when Vpp_in is greater than the base power voltage level plus a threshold voltage of the PMOS transistor (vpwr+Vtp).

12. A switch system of claim 10 wherein the second component includes a PMOS transistor that turns on when Vpp_in is raised above vpwr making vppgate follow Vpp_in.

13. A switch system of claim 10 wherein the third component includes a stack of NMOS transistors that draw a small keep-alive current during the high voltage mode.

14. A switch system of claim 10 wherein the third component includes an NMOS transistor that controls vppgate output from the switch pre-driver.

15. A switch pre-driver comprising:
a fist component to set an output of the switch pre-driver equal to a base power voltage level (vpwr);
a second component to set the output of the switch pre-driver equal to a transition voltage level; and
a third component to set the output of the switch pre-driver equal to a pre-determined voltage level during a high voltage mode, a difference between a voltage input of the switch pre-driver and the output of the switch pre-driver is less than a breakdown limit of components of a switch driver coupled to the switch pre-driver; and
a detection circuit to activate the switch pre-driver in response to a high voltage mode input signal and to couple the output of the switch pre-driver to turn on the switch driver.

16. A switch pre-driver of claim 15 wherein the first component is disabled when a voltage input (Vpp_in) of the switch pre-driver is greater than the base power voltage level (vpwr) plus a threshold voltage (Vtp) of the first component.

17. A switch pre-driver of claim 15 wherein the second component includes a weak PMOS that turns on when a voltage input (Vpp_in) of the switch pre-driver is raised above the base power voltage level (vpwr) making the output of the switch pre-driver (vppgate) follow the voltage input (Vpp_in).

18. A switch pre-driver of claim 15 wherein the third component is activated when a high voltage is detected and a circuit coupled to the switch pre-driver enters a high voltage mode.

19. A switch pre-driver of claim 15 wherein the third component includes a stack of NMOS transistors that draw a small keep-alive current.

20. A switch pre-driver of claim 15 wherein the third component includes a strong NMOS transistor that controls the output of the switch pre-driver (vppgate).

* * * * *